United States Patent [19]
Matsuki

[11] Patent Number: 5,285,292
[45] Date of Patent: Feb. 8, 1994

[54] DYNAMIC RANDOM ACCESS MEMORY DEVICE WITH FLASH WRITE MODE CARRYING OUT FOR SELECTED MEMORY CELL ARRAYS

[75] Inventor: Kazuhiko Matsuki, Kanagawa, Japan
[73] Assignee: NEC Corporation, Tokyo, Japan
[21] Appl. No.: 838,841
[22] Filed: Feb. 21, 1992
[30] Foreign Application Priority Data
  Feb. 22, 1991 [JP] Japan .................. 3-050501
[51] Int. Cl.⁵ .................. G11C 7/00; G11C 11/34
[52] U.S. Cl. .................. 358/456; 365/145; 365/189.01; 365/189.08; 365/226
[58] Field of Search .......... 358/456; 365/201, 203, 365/218, 63, 238.5, 189.04, 190, 201, 149, 203, 202, 200, 230.06, 189.07, 189.08, 189.01, 227, 145, 189.05, 230.03, 222, 204, 210, 226, 189.09, 174, 154

[56] References Cited
U.S. PATENT DOCUMENTS

| | | | |
|---|---|---|---|
| 4,567,578 | 1/1986 | Cohen et al. | 365/189 |
| 4,873,664 | 10/1989 | Eaton, Jr. | 365/145 |
| 5,003,510 | 3/1991 | Kamisaki | 365/189.01 |
| 5,010,518 | 4/1991 | Toda | 365/145 |
| 5,036,494 | 7/1991 | Wise et al. | 365/230.03 |
| 5,208,774 | 5/1993 | Shibue | 365/189.08 |
| 5,222,044 | 6/1993 | Tsujimoto | 365/226 |

Primary Examiner—Paul Ip
Attorney, Agent, or Firm—Sughrue, Mion, Zinn, Macpeak & Seas

[57] ABSTRACT

A dynamic random access memory device selectively enters a flush write-in mode of operation, and has a plurality of controlling circuits respectively associated with a plurality of sense amplifier circuit groups which in turn are provided in association with a plurality of memory cell sub-arrays, wherein the plurality of controlling circuits produce activation signals respectively assigned the plurality of sense amplifier circuit groups in such a manner that time delay is introduced between activation of the sense amplifier circuits supplied with flush write data bits and activation of the sense amplifier circuits with refreshing data bits read out from non-selected memory cell groups, thereby preventing refresh data bits from undesirable data destruction without sacrifice of write-in speed.

5 Claims, 4 Drawing Sheets

DYNAMIC RANDOM ACCESS MEMORY DEVICE WITH FLASH WRITE MODE CARRYING OUT FOR SELECTED MEMORY CELL ARRAYS

FIELD OF THE INVENTION

This invention relates to a dynamic random access memory device and, more particularly, to a controlling unit for sense amplifier units respectively associated with a plurality of memory cell sub-arrays.

DESCRIPTION OF THE RELATED ART

The dynamic random access memory device has found a wide variety of application, and an image processing system stores image data in the dynamic random access memory device. The dynamic random access memory device has been increased in memory capacity, and new functions are expected to effectively manage the large memory capacity. If the dynamic random access memory device serves as a data storage for the image data, a flush write-in function is desirable. If the dynamic random access memory device enters a flush write-in mode of operation, a write-in data bit of either logic "1" or "0" level is concurrently written into a row of memory cells to be selected. If the dynamic random access memory device is equipped with a plurality of input/output ports respectively associated with memory cell sub-arrays, it is also desirable to selectively enable the plurality of input/output ports, and a flush write-in data bit is written from the enabled input/output port to the associated memory cell sub-arrays.

FIG. 1 shows a typical example of the dynamic random access memory device which comprises first and second memory cell sub-arrays 1a and 1b respectively with memory cells M11/ M1i/ M21/M2i and M1j/ M1n/ M2j/ M2n arranged in matrix. Each of the memory cells M11 to M2n is implemented by a series combination of an n-channel enhancement type transfer transistor TF and a storage capacitor SC, and the counter electrodes of the storage capacitors SC are coupled with a constant voltage line CP. Word lines WL1 and WL2 are shared between the first and second memory cell sub-arrays 1a and 1b, and the word lines WL1 to WL2 are coupled with the gate electrodes of the n-channel enhancement type transfer transistors TF of the respective rows. A plurality of bit line pairs BLP1, BLPi, BLPj and BLPn are associated with the columns of the first and second memory cell sub-arrays 1a and 1b, and the drain nodes of the n-channel enhancement type transfer transistors TF of each column are coupled with either component bit line BLa or BLb of the associated bit line pair.

A plurality of sense amplifier circuits SA1, SAi, SAj and SAn are coupled with the bit line pairs BLP1 to BLPn, respectively, and are broken down into first and second sense amplifier circuit groups 2a and 2b. Each of the sense amplifier circuits SA1 to SAn comprises a first series combination of a p-channel enhancement type field effect transistor QP1 and an n-channel enhancement type field effect transistor QN1 and a second series combination of a p-channel enhancement type field effect transistor QP2 and an n-channel enhancement type field effect transistor QN2, and the component bit lines BLa and BLb of the associated bit line pair are coupled through the common drain nodes N1 and N2 in the first and second series combinations with the gate electrodes of the p-channel enhancement type field effect transistor QP2 and the n-channel enhancement type field effect transistor QN2 and with the gate electrodes of the p-channel enhancement type field effect transistor QP1 and the n-channel enhancement type field effect transistor QN1. However, the first and second series combinations of all the sense amplifier circuits SA1 to SAn are coupled in parallel between two control lines 3a and 3b, and a single control circuit 4 drives the control lines 3a and 3b to active high and low voltage levels. For this reason,, all of the sense amplifier circuits SA1 to SAn are simultaneously activated to develop differential voltages on the associated bit line pairs BLP1 to BLPn.

A plurality of transfer circuits TR1, TRi, TRj and TRn are broken down into first and second transfer gate units 5a and 5b, and the first and second transfer gate units 5a and 5b are associated with the first and second memory cell sub-arrays 1a and 1b, respectively. The transfer circuits TR1 to TRn are respectively coupled with the sense amplifier circuits SA1 to SAn and, accordingly, with the bit line pairs BLP1 to BLPn, and each of the transfer circuits TR1 to TRn is implemented by two parallel combination of n-channel enhancement type field effect transistors QN4 and QN5. The first and second transfer gate units 5a and 5b are respectively associated with flush write data line pairs DLP1 and DLP2, and each of the flush write data line pairs DLP1 and DLP2 has two component data lines DLa and DLb. The n-channel enhancement type field effect transistors QN4 of the first transfer gate unit 5a are coupled between the component data line DLa of the flush write data line pair DLP1 and the component bit lines BLa associated with the first memory cell sub-array 1a, and the n-channel enhancement type field effect transistors QN5 of the first transfer gate unit 5a are coupled between the other component data line DLb of the flush write data line pair DLP1 and the other component bit lines BLb. All of the n-channel enhancement type field effect transistors QN4 and QN5 of the first transfer gate unit 5a are concurrently gated by a first transfer signal line TG1. The n-channel enhancement type field effect transistors QN4 of the second transfer gate unit 5b are coupled between the component data line DLa of the flush write data line pair DLP2 and the component bit lines BLa associated with the second memory cell sub-array 1b, and the n-channel enhancement type field effect transistors QN5 of the second transfer gate unit 5b are coupled between the other component data line DLb of the flush write data line pair DLP2 and the other component bit lines BLb. All of the n-channel enhancement type field effect transistors QN4 and QN5 of the second transfer gate unit 5b are concurrently gated by a second transfer signal line TG2.

Description is hereinbelow made on the circuit behavior in the flush write-in mode of operation on the first memory cell sub-array 1a with a flush write data bit of logic "1" level. FIG. 2 shows the waveforms of essential signals in the flush write-in mode of operation. Data bits of logic "0" level have been already stored in the memory cells M21 to M2i, and the memory cells M2j to M2n have stored data bits of logic "1" level.

The sequence of the flush write-in mode of operation starts with precharging. Precharging transistors (not shown) and associated equalizing transistors allow the bit line pairs BLP1 to BLPn and the control lines 3a and 3b to balance at an intermediate voltage level V0 between high and low voltage levels H and L. The flush write data bit of logic "1" causes the flush write data line pairs DLP1 and DLP2 to have the component data lines DLa of the high voltage level H and the component data lines DLb of the low voltage level L.

At time t1, the word line WL2 goes up to a high voltage level. However, the word line WL1 remains low. Then, not only the memory cells M21 to M2i of the first memory cell sub-array 1a but also the memory cells M2j to M2n of the second memory cell sub-array 1b are activated, and the n-channel enhancement type transfer transistors TF concurrently turn on so that the storage capacitors SC are coupled with the associated component bit lines BLa of the bit line pairs BLP1 to BLPn. Since the data bits of logic "0" are stored in the memory cells M21 to M2i, the accumulating electrodes of the storage capacitors SC are lifted toward the intermediate voltage level V0, and the component bit lines BLa of the associated bit line pairs BLP1 to BLPi are slightly decayed due to current flowing into the storage capacitors SC. The component bit lines BLa of the bit line pairs BLP1 to BLPi are expected to be saturated at tens millivolts lower than the intermediate voltage level V0. On the other hand, the storage capacitors SC of the memory cells M2j to M2n are decayed from the high voltage level H indicative of the data bits of logic "1" level toward the intermediate voltage level V0, and the associated component bit lines BLa are slightly lifted. The component bit lines BLa of the bit line pairs BLPj to BLPn are expected to be saturated at tens millivolts higher than the intermediate voltage level V0.

The control signal lines SA1 to SA2 are driven to the high voltage level H and the low voltage level L at time t2, and the transfer signal line TG1 is concurrently lifted to a high voltage level. However, the transfer signal line TG2 remains in the low voltage level L, and prevents the second memory cell sub-array 1b from the flush write data bit. Then, not only the sense amplifier circuits SA1 to SAi but also the sense amplifier circuits SAj to SAn are activated, and try to develop differential voltage levels on the bit line pairs BLP1 to BLPn. With the transfer signal line TG1, the transfer circuits TR1 to TRi propagate the high voltage level H on the component data line DLa and the low voltage level L on the component data line DLb of the flush write data line pair DLP1 to the bit line pairs BLP1 to BLPi, and the sense amplifier circuits SA1 to SAi quickly develop differential voltage levels each indicative of the flush write data bit. Therefore, the voltage levels on the bit lines BLa of the bit line pairs BLP1 to BLPi are rapidly lifted to the high voltage level H, and the storage capacitors SC of the memory cells M21 to M2i store the high voltage levels on the associated bit lines BLa. However, the flush write data bit is never transferred to the bit line pairs BLPj to BLPn, and, accordingly, the sense amplifier circuits SAj to SAn develop the small differences indicative of the data bits previously stored in the memory cells M2j to M2n. Therefore, the voltage levels on the bit lines BLa of the bit line pairs BLPj to BLPn are further lifted to the high voltage level H, and are restored in the storage capacitors of the memory cells M2j to M2n.

A problem is encountered in the prior art dynamic random access memory device in that data bits stored in a memory cell sub-array prohibited from a flush write data bit are liable to be inverted upon activation of the associated sense amplifier circuits. In detail, as described hereinbefore, the sense amplifier circuits associated with the memory cell sub-array prohibited from the flush write data bit develop small differences indicative of the data bits read out therefrom, and the small differences gradually take place on the associated bit line pairs after selection of the associated word line at time t1. If the interval between times t1 and t2 is too short to sufficiently develop the small differences, any turbulence such as, for example, voltage fluctuation easily replaces the voltage levels on the bit lines BLa and BLb with each other.

SUMMARY OF THE INVENTION

It is therefore an important object of the present invention to provide a dynamic random access memory device with a flush write-in mode of operation which is free from the problem inherent in the prior art dynamic random access memory device.

To accomplish the object, the present invention proposes to sequentially activate sense amplifier circuits.

In accordance with the present invention, there is provided a dynamic random access memory device with a standard write-in mode and a flush write-in mode of operation, comprising: a) a plurality of memory cells respectively storing data bits, and arranged in rows and columns, the columns being divided into a plurality of memory cell groups for selectively carrying out the flush write-in mode of operation; b) a plurality of word lines respectively associated with the rows, and selectively driven to an active level for allowing data bits stored therein to be read out from the associated memory cells; c) a plurality of bit line pairs respectively associated with the columns, and respectively coupled with the plurality of memory cells of the associated columns for propagating differential voltage levels each indicative of a data bit; d) a plurality of sense amplifier circuits respectively coupled with the plurality of bit line pairs, and operative to develop differential voltage levels on the plurality of bit line pairs, the plurality of sense amplifier circuits being divided into sense amplifier circuit groups respectively associated with the memory cell groups; e) a plurality of flush write data line pairs respectively associated with the sense amplifier circuit groups, and respectively propagating differential voltage levels respectively indicative of flush write data bits; f) a plurality of transfer units respectively coupled between the sense amplifier circuit groups and the plurality of flush write data line pairs, and responsive to transfer signals for selectively transferring the flush write data bits to the associated sense amplifier circuit groups in the flush write-in mode of operation; and g) a plurality of controlling circuits respectively associated with the sense amplifier circuit groups, and producing activating signals respectively supplied to the sense amplifier circuit groups in such a manner that time delay is introduced between activation of sense amplifier circuits supplied with the flush write data bits and activation of the other sense amplifier circuits prohibited from the flush write data bits in the flush write-in mode of operation.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENT

Figure 1:
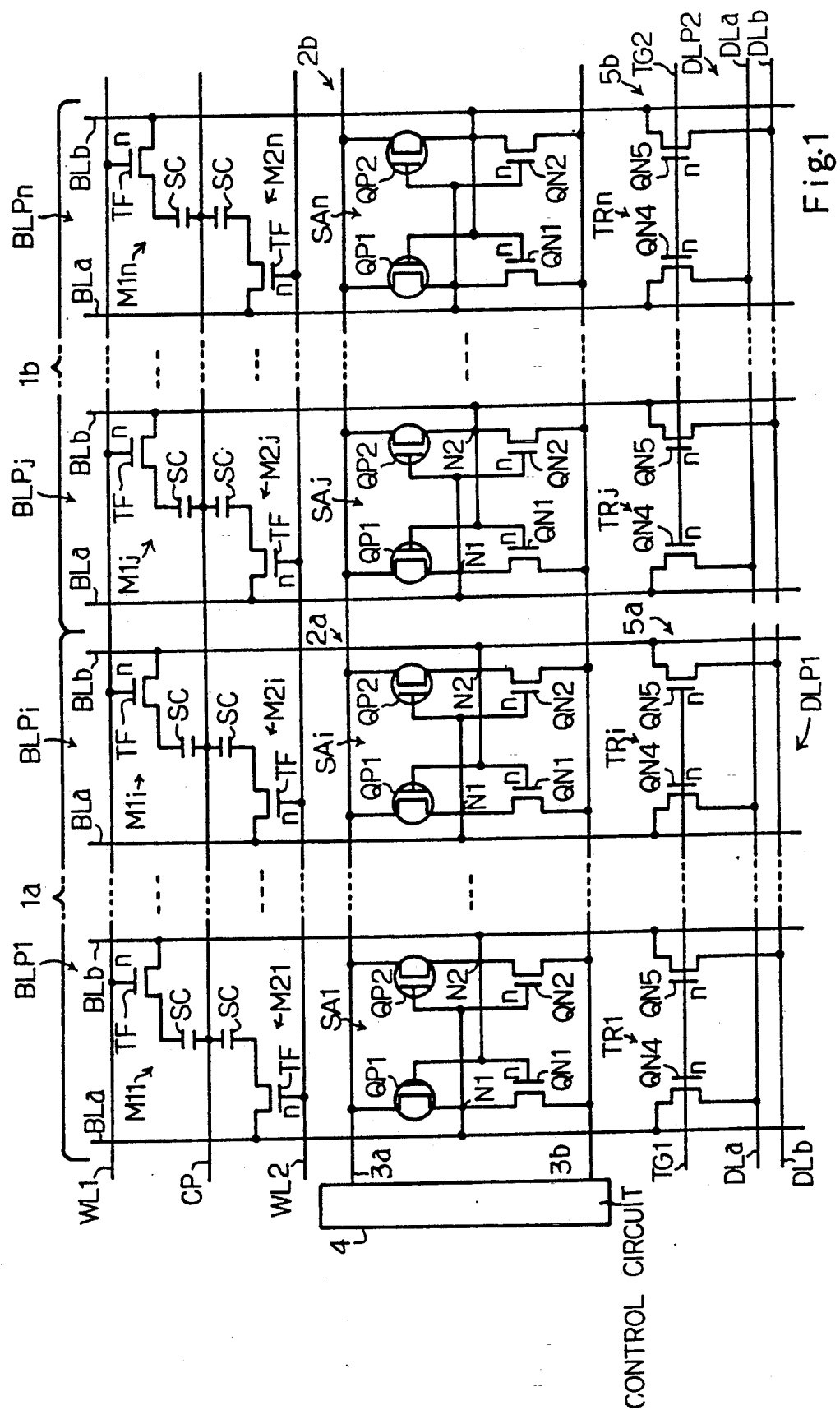
FIG. 1 is a circuit diagram showing the circuit arrangement of the prior art dynamic random access memory device.
Figure 2:
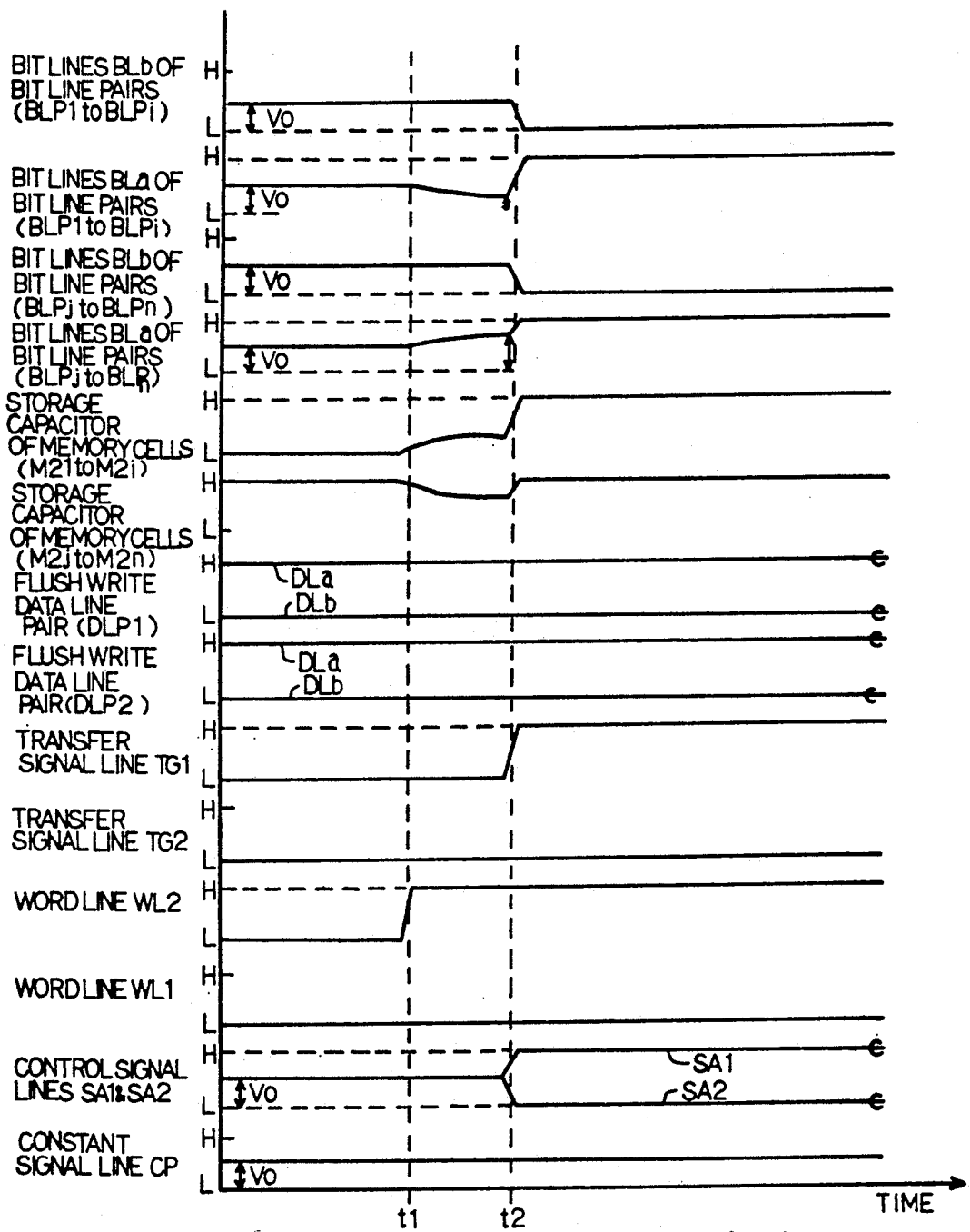
FIG. 2 is a timing chart showing the sequence of a flush write-in mode of operation on one of the memory cell sub-array incorporated in the prior art dynamic random access memory device.
Figure 3:
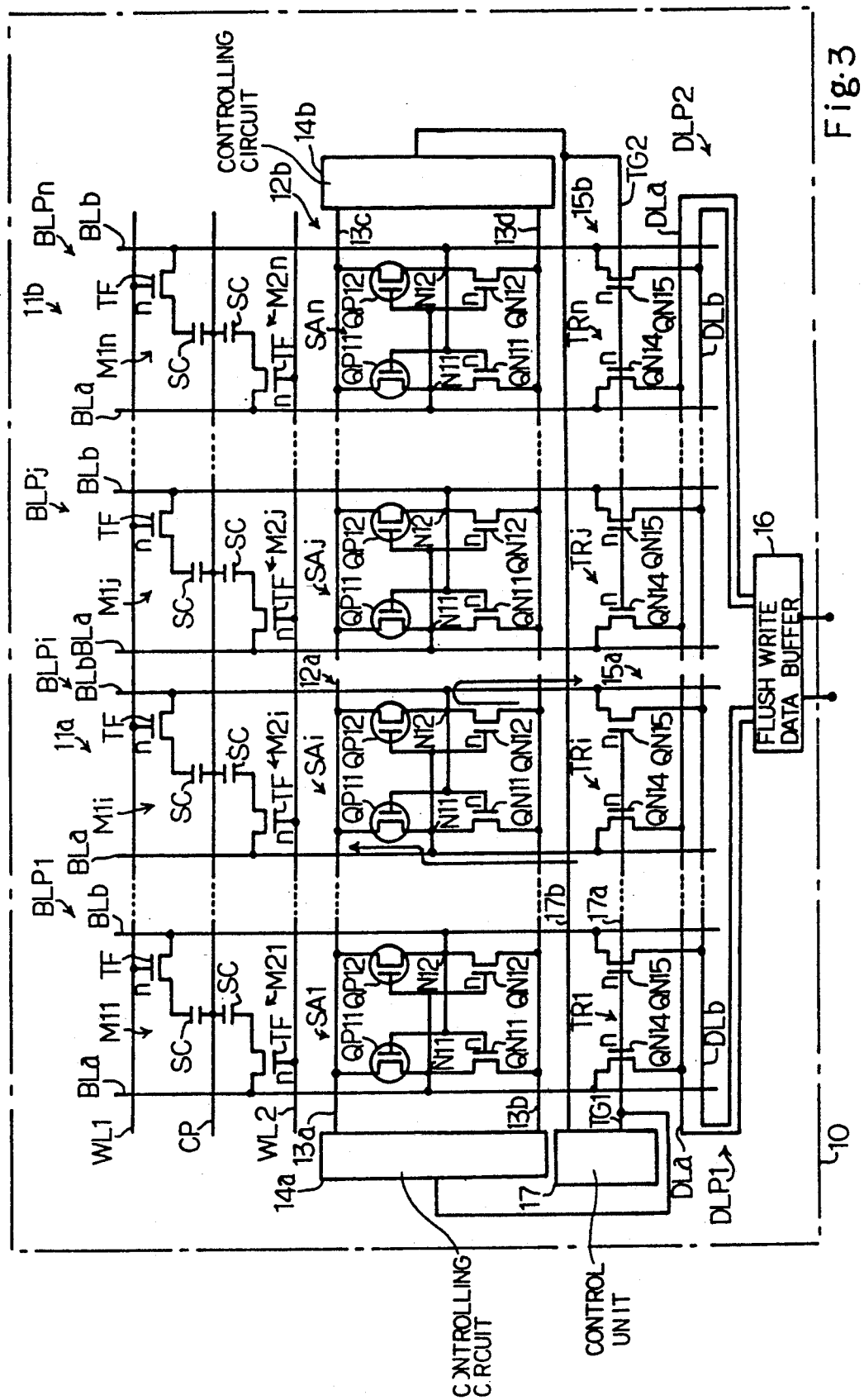
FIG. 3 is a circuit diagram showing the circuit arrangement of a dynamic random access memory device according to the present invention.

Referring to FIG. 3, of the drawings, a dynamic random access memory device embodying the present invention is fabricated on a semiconductor chip 10, and comprises a memory cell array with memory cells M11, M1i, M1j, M1n, M21, M2i, M2j and M2n arranged in rows and columns. The memory cell array is broken down into first and second memory cell sub-arrays 11a and 11b, and the memory cells M11 to M1i/ M21 to M2i and M1j to M1n/M2j to M2n belong to the first and second memory cell sub-arrays 11a and 11b. Each of the memory cells M11 to M2n is implemented by a series combination of an n-channel enhancement type transfer transistor TF and a storage capacitor SC, and the counter electrodes of the storage capacitors SC are coupled with a constant voltage line CP. Although only two rows of the memory cells M11 to M2n are shown in FIG. 3, a large number of rows of memory cells are incorporated in the memory cell array.

Word lines WL1 and WL2 are shared between the first and second memory cell sub-arrays 11a and 11b, and the word lines WL1 to WL2 are coupled with the gate electrodes of the n-channel enhancement type transfer transistors TF of the associated rows. A plurality of bit line pairs BLP1, BLPi, BLPj and BLPn are associated with the columns of the memory cells M11 to M2n, and the drain nodes of the n-channel enhancement type transfer transistors TF of each column are coupled with either component bit line BLa or BLb of the associated bit line pair.

A plurality of sense amplifier circuits SA1, SAi, SAj and SAn are coupled with the bit line pairs BLP1 to BLPn, respectively, and are broken down into first and second sense amplifier circuit groups 12a and 12b. The first and second sense amplifier circuit groups 12a and 12b are respectively associated with the first and second memory cell sub-arrays 11a and 11b. Each of the sense amplifier circuits SA1 to SAn comprises a first series combination of a p-channel enhancement type field effect transistor QP11 and an n-channel enhancement type field effect transistor QN11 and a second series combination of a p-channel enhancement type field effect transistor QP12 and an n-channel enhancement type field effect transistor QN12, and the component bit lines BLa and BLb of the associated bit line pair are coupled through the common drain nodes N11 and N12 in the first and second series combinations with the gate electrodes of the p-channel enhancement type field effect transistor QP12 and the n-channel enhancement type field effect transistor QN12 and with the gate electrodes of the p-channel enhancement type field effect transistor QP11 and the n-channel enhancement type field effect transistor QN11. However, the first and second series combinations of the sense amplifier circuits SA1 to SAi are coupled in parallel between control signal lines 13a and 13b, and the first and second series combinations of the sense amplifier circuits SAj to SAn are coupled in parallel between control signal lines 13c and 13d. The control signal lines 13a and 13b are driven to high and low voltage levels H and L by a first controlling circuit 14a, and the control signal lines 13c and 13d are driven to the high and low voltage levels H and L by a controlling circuit 14b. For this reason, the sense amplifier circuits SA1 to SAi are independently activated from the sense amplifier circuits SAj to SAn to develop differential voltages on the associated bit line pairs.

A plurality of transfer circuits TR1, TRi, TRj and TRn are broken down into first and second transfer gate units 15a and 15b, and the first and second transfer gate units 15a and 15b are respectively associated with the first and second sense amplifier circuit groups 12a and 12b and, accordingly, with the first and second memory cell sub-arrays 11a and 11b. The transfer circuits TR1 to TRn are respectively coupled with the sense amplifier circuits SA1 to SAn and, accordingly, with the bit line pairs BLP1 to BLPn, and each of the transfer circuits TR1 to TRn is implemented by two parallel combination of n-channel enhancement type field effect transistors QN14 and QN15. The first and second transfer gate units 15a and 15b are respectively associated with flush write data line pairs DLP11 and DLP12, and each of the flush write data line pairs DLP1 and DLP2 has two component data lines DLa and DLb. A flush write data buffer unit 16 supplies differential voltage levels respectively indicative of flush write data bits to the flush write data line pairs DLP1 and DLP2.

The n-channel enhancement type field effect transistors QN14 of the first transfer gate unit 15a are coupled between the component data line DLa of the flush write data line pair DLP1 and the component bit lines BLa associated with the first memory cell sub-array 11a, and the n-channel enhancement type field effect transistors QN15 of the first transfer gate unit 15a are coupled between the other component data line DLb of the flush write data line pair DLP1 and the other component bit lines BLb. All of the n-channel enhancement type field effect transistors QN14 and QN15 of the first transfer unit 15a are concurrently gated by a first transfer signal line TG1. The n-channel enhancement type field effect transistors QN14 of the other transfer gate unit 15b are coupled between the component data line DLa of the flush write data line pair DLP2 and the component bit lines BLa associated with the second memory cell sub-array 11b, and the n-channel enhancement type field effect transistors QN15 of the second transfer gate unit 15b are coupled between the other component data line DLb of the flush write data line pair DLP2 and the other component bit lines BLb. All of the n-channel enhancement type field effect transistors QN14 and QN15 of the second transfer gate unit 15b are concurrently gated by a second transfer signal line TG2. A control unit 17 is associated with the first and second transfer gate units 15a and 15b, and control signal lines 17a and 17b are respectively shared between the transfer circuits TR1 to TRi and between the transfer circuits TRj and TRn. Namely, the control signal line 17a is coupled with the gate electrodes of the n-channel enhancement type field effect transistors QN14 and QN15 of the first transfer gate unit 15a, and the n-channel enhancement type field effect transistors QN14 and QN15 of the second transfer gate unit 15b are concurrently gated by the control signal line 17b. The control signal lines 17a and 17b are further coupled with the controlling circuits 14a and 14b so that the controlling circuits 15a and 15b can determine whether or not the associated first and second transfer gate units 15a and 15b transfer flush write data bits to the associated first and second memory cell sub-arrays 11a and 11b. If flush write data bits are supplied to the first and second memory cell sub-arrays 11a and 11b, the associated controlling circuits 14a and 14b immediately activate the first and second sense amplifier groups 12a and 12b. However, if a memory cell sub-array or arrays are prohibited from the flush write data bits, time delay is introduced between the activation of the first and second sense amplifier groups with the flush write data bits and activation of the associated sense amplifier group or groups. The amount of time delay is determined in such a manner as to be long enough to stabilize small differential voltage levels indicative of data bits read out from the associated memory cell sub-array or sub-arrays.

Figure 4:
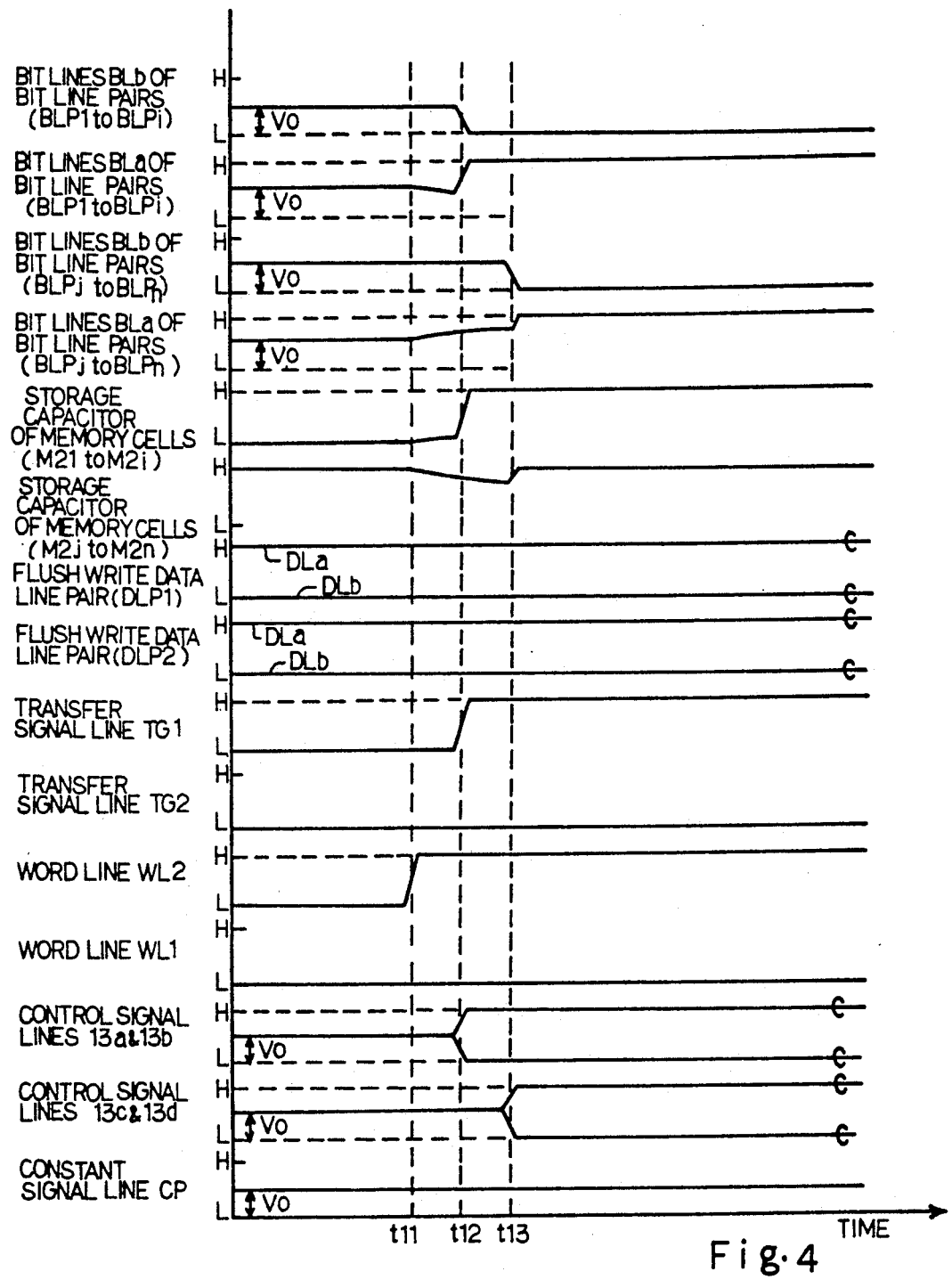
FIG. 4 is a timing chart showing the sequence of a flush write-in mode of operation on the dynamic random access memory device shown in FIG. 3.

Description is hereinbelow made on the circuit behavior of the dynamic random access memory device embodying the present invention with reference to FIG. 4 of the drawings. In the following description, a flush write data bit of logic "1" level is assumed to be distributed to the first memory cell sub-array 11a, however, the other memory cell sub-array 11b is prohibited from a flush write data bit on the flush write data signal line pair DLP2. Data bits of logic "0" level have been already stored in the memory cells M21 to M2i of the first memory cell sub-array 11a, and the memory cells M2j to M2n of the other memory cell sub-array 11b have stored data bits of logic "1" level. For this reason, the accumulating electrodes of the storage capacitors SC of the memory cells M21 to M2i are in the low voltage level L, and the accumulating electrodes of the storage capacitors SC of the memory cells M2j to M2n are in the high voltage level H.

The sequence of the flush write-in mode of operation starts with precharging. Precharging transistors (not shown) and associated equalizing transistors allow the bit line pairs BLP1 to BLPn and the control lines 13a to 13d to balance at an intermediate voltage level V0 between high and low voltage levels H and L. The flush write data bit of logic "1" causes the flush write data line pairs DLP1 and DLP2 to have the component data lines DLa of the high voltage level H and the component data lines DLb of the low voltage level L.

At time t11, the word line WL2 goes up to a high voltage level. However, the word line WL1 remains low. Then, not only the memory cells M21 to M2i of the first memory cell sub-array 11a but also the memory cells M2j to M2n of the second memory cell sub-array 11b are activated, and the n-channel enhancement type transfer transistors TF concurrently turn on so that the storage capacitors SC are coupled with the associated component bit lines BLa of the bit line pairs BLP1 to BLPn. Since the data bits of logic "0" are stored in the memory cells M21 to M2i, the accumulating electrodes of the storage capacitors SC are lifted toward the intermediate voltage level V0, and the component bit lines BLa of the associated bit line pairs BLP1 to BLPi are slightly decayed due to current flowing into the storage capacitors SC. On the other hand, the storage capacitors SC of the memory cells M2j to M2n are decayed from the high voltage level H indicative of the data bits of logic "1" level toward the intermediate voltage level V0, and the associated component bit lines BLa are slightly lifted.

Since the flush write data bits have already produced differential voltage levels on the flush write data line pairs DLP1 and DLP2, the transfer signal line TG1 goes up to the active high voltage level H at time t12, and the controlling circuit 14a concurrently drives the associated control signal lines 13a and 13b to the high and low voltage levels. However, the other transfer signal line TG2 remains low, and the other controlling circuit 14b maintains the associated control signal lines 13c and 13d in the intermediate voltage level V0 in this stage. The differential voltage level on the flush write data line pair DLP1 is distributed to the bit line pairs BLP1 to BLPi, and the sense amplifier circuits SA1 to SAi are simultaneously activated so as to develop the differential voltage levels on the bit line pairs BLP1 to BLPi. Thus, the sense amplifier circuits SA1 to SAi are activated before reaching saturated voltage level tens millivolts lower than the intermediate voltage level V0, and, accordingly, the flush write data bit is quickly stored in the storage capacitor SC of each of the memory cells M21 to M2i. However, the sense amplifier circuits SAj to SAn remain inactive, and the storage capacitors SC of the memory cells M2j to M2n continue to slowly develop the small differential voltage levels on the associated bit line pairs BLPj to BLPn.

The small differential voltage levels on the bit line pairs BLPj to BLPn have been saturated before time t13, and the component bit lines BLa of the bit line pairs BLPj to BLPn are higher than the intermediate voltage level V0 by tens millivolts. In this circumstances, any undesirable inversion hardly takes place at time t13. Then, the controlling circuit 14b drives the associated control signal lines 13c and 13d to the high and low voltage levels H and L, and the sense amplifier circuits SAj to SAn are activated to develop the small differential voltage levels on the bit line pairs BLPj to BLPn. The differential voltage levels thus developed are respectively restored in the memory cells M2j to M2n, and the data bits in the memory cells M2j to M2n are refreshed without any undesirable logical inversion.

In the above described assumption, the flush write-in mode of operation is carried out for the first memory cell sub-array 11a only. However, if flush write data bits are written into the memory cells M11 to M2n of the first and second memory cell sub-arrays 11a and 11b, respectively, the controlling circuits 14a and 14b are simultaneously activated at time t12.

As will be understood from the foregoing description, the dynamic random access memory device according to the present invention sequentially activates the first and second sense amplifier groups 12a and 12b, and any undesirable logical inversion never takes place in the refreshed data bits.

Although particular embodiments of the present invention have been shown and described, it will be obvious to those skilled in the art that various changes and modifications may be made without departing from the spirit and scope of the present invention. For example, a memory cell array may be broken down into more than two memory cell sub-arrays, and a dynamic random access memory device may further have other function modes desirable for an application.

What is claimed is:

1. A dynamic random access memory device with a flush write-in mode of operation, comprising:
   a) a plurality of memory cells respectively storing data bits, and arranged in rows and columns, said columns being divided into a plurality of memory cell groups for selectively carrying out said flush write-in mode of operation;

b) a plurality of word lines respectively associated with said rows, and selectively driven to an active level for allowing data bits to be read out from the associated memory cells;

c) a plurality of bit line pairs respectively associated with said columns, and respectively coupled with said plurality of memory cells of said associated columns for propagating differential voltage levels each indicative of a data bit;

d) a plurality of sense amplifier circuits respectively coupled with said plurality of bit line pairs, and operative to develop differential voltage levels on said plurality of bit line pairs, said plurality of sense amplifier circuits being divided into sense amplifier circuit groups respectively associated with said memory cell groups;

e) a plurality of flush write data line pairs respectively associated with said sense amplifier circuit groups, and respectively propagating differential voltage levels respectively indicative of flush write data bits;

f) a plurality of transfer units respectively coupled between said sense amplifier groups and said plurality of flush write data line pairs, and responsive to transfer signals for selectively transferring said flush write data bits to said associated sense amplifier circuit groups in said flush write-in mode of operation; and g) a plurality of controlling circuits respectively associated with said sense amplifier circuit groups, and producing activating signals respectively supplied to said sense amplifier circuit groups in such a manner that time delay is introduced between activation of sense amplifier circuits supplied with said flush write data bits and activation of the other sense amplifier-circuits prohibited from said flush write data bits in said flush write-in mode of operation.

2. A dynamic random access memory device as set forth in claim 1, in which said activation of said sense amplifier circuits supplied with said flush write data bits is earlier than saturation of differential voltage levels indicative of said data bits read out from said memory cells, and in which said activation of said sense amplifier circuits prohibited from said flush write data bits is carried out after said differential voltage levels indicative of said data bits read out from said memory cells are substantially saturated.

3. A dynamic random access memory device as set forth in claim 1, in which each of said plurality of memory cells is implemented by a series combination of a transfer transistor and a storage capacitor.

4. A dynamic random access memory device as set forth in claim 1, in which each of said plurality of sense amplifier circuits is implemented by a first series combination of a first p-channel enhancement type transistor and a second n-channel enhancement type transistor coupled between a pair of control signal lines and a second series combination of a third p-channel enhancement type transistor and a fourth n-channel enhancement type transistor coupled between said pair of control signal lines, said first p-channel enhancement type transistor and said second n-channel enhancement type transistor being gated by a common drain node in said second series combination, said third p-channel enhancement type transistor and said fourth n-channel enhancement type transistor being gated by a common drain node in said first series combination.

5. A dynamic random access memory device as set forth in claim 1, in which each of said transfer units is implemented by n-channel enhancement type transfer transistors twice as large in number as the associated sense amplifier circuits.

* * * * *